US012787216B2

(12) United States Patent
Paehrisch et al.

(10) Patent No.: US 12,787,216 B2
(45) Date of Patent: Nov. 3, 2026

(54) COOLER FOR COOLING POWER ELECTRONICS

(71) Applicant: Robert Bosch GmbH, Stuttgart (DE)

(72) Inventors: Maik Paehrisch, Reutlingen (DE); Max Florian Beck, Vaihingen an der Enz (DE)

(73) Assignee: Robert Bosch GmbH, Stuttgart (DE)

( * ) Notice: Subject to any disclaimer, the term of this patent is extended or adjusted under 35 U.S.C. 154(b) by 212 days.

(21) Appl. No.: 18/691,572

(22) PCT Filed: Aug. 11, 2022

(86) PCT No.: PCT/EP2022/072563
§ 371 (c)(1),
(2) Date: Mar. 13, 2024

(87) PCT Pub. No.: WO2023/051989
PCT Pub. Date: Apr. 6, 2023

(65) Prior Publication Data
US 2024/0381567 A1 Nov. 14, 2024

(30) Foreign Application Priority Data
Sep. 30, 2021 (DE) ..................... 10 2021 210 934.9

(51) Int. Cl.
*H05K 7/20* (2006.01)

(52) U.S. Cl.
CPC ..... *H05K 7/20254* (2013.01); *H05K 7/20927* (2013.01)

(58) Field of Classification Search
CPC ........... H05K 7/20254; H05K 7/20927; H05K 7/20409; H05K 7/20145; H05K 7/20;
(Continued)

(56) References Cited

U.S. PATENT DOCUMENTS 6,073,686 A * 6/2000 Park ...................... F28F 9/0221 165/110
6,639,798 B1 * 10/2003 Jeter .................. H05K 7/20927 174/15.1
(Continued)

FOREIGN PATENT DOCUMENTS

EP 3745455 A1 12/2020
JP 2009152455 A 7/2009
(Continued)

OTHER PUBLICATIONS

Translation of International Search Report for Application No. PCT/EP2022/072563 dated Dec. 8, 2022 (2 pages).
(Continued)

*Primary Examiner* — Michael A Matey
(74) *Attorney, Agent, or Firm* — Michael Best & Friedrich LLP

(57) ABSTRACT

The present invention relates to a cooler (1) for cooling power electronics (101), comprising a housing (2) for accommodating the power electronics (101) and a cooling fin arrangement (7) with a large number of fins (9) in a cooling channel (6) of the housing (2), wherein fluid can flow through the cooling fin arrangement (7) along a longitudinal axis (30); the cooling fin arrangement (7) comprises a plurality of cooling fin sections (71, 72, 73); adjacent cooling fin sections have different fin geometries (9); and the cooling fin sections (71, 72, 72) are fixedly connected to one another.

9 Claims, 5 Drawing Sheets

(58) Field of Classification Search
CPC .. H05K 7/2039; H05K 7/205; H05K 7/20518; H10W 40/228; H10W 40/226; H10W 40/258; H10W 40/40; H10W 40/037; F28F 3/027; F28F 1/128; F28F 19/00; F28F 2260/00; F28F 3/025; F28F 3/02; F28F 2215/04; F28F 13/12; F28F 13/08; B23P 2700/10; B23P 15/26; F28D 2021/0029; B21D 53/025; B23K 2101/14; B64C 2230/26; G06F 1/20; G06F 2200/201
See application file for complete search history.

(56) References Cited

U.S. PATENT DOCUMENTS

| | | | | |
|---|---|---|---|---|
| 7,961,462 | B2 * | 6/2011 | Hernon | H05K 7/20145 361/694 |
| 11,162,742 | B2 * | 11/2021 | Hoepfner | F28F 1/128 |
| 11,525,638 | B2 | 12/2022 | Vanderwees et al. | |
| 2015/0189791 | A1 | 7/2015 | Tamura | |
| 2016/0129792 | A1 * | 5/2016 | Gohara | B60L 3/0084 29/890.035 |
| 2016/0305720 | A1 * | 10/2016 | Rhee | F28F 3/025 |
| 2019/0331428 | A1 * | 10/2019 | Arata | H01L 23/473 |
| 2019/0360766 | A1 * | 11/2019 | Kenney | F28F 3/027 |

FOREIGN PATENT DOCUMENTS

| | | | |
|---|---|---|---|
| JP | 2010203694 | A | 9/2010 |
| JP | 2011129823 | A | 6/2011 |
| JP | 2019020108 | A | 2/2019 |
| TW | 200926951 | A | 6/2009 |
| WO | 2019189477 | A1 | 10/2019 |
| WO | 2019210413 | A1 | 11/2019 |

OTHER PUBLICATIONS

Non-final Office Action issued by the U.S. Patent Office for U.S. Appl. No. 18/691,248 dated Jan. 16, 2026 (17 pages).
Translation of Reasons for Refusal by the Japanese Patent Office for Application No. 2024-519559 dated Feb. 25, 2025 (3 pages).
Translation of the Written Opinion for Application No. PCT/EP2022/072565 dated Dec. 9, 2022 (7 pages).
Final Office Action issued by the U.S. Patent Office for U.S. Appl. No. 18/691,248 dated May 7, 2026 (19 pages).

* cited by examiner

COOLER FOR COOLING POWER ELECTRONICS

BACKGROUND

The present invention relates to a cooler for cooling power electronics. The invention also discloses an arrangement comprising the cooler together with the power electronics.

Power semiconductors in power electronics carry high electric currents. Together with switching losses, the resulting conduction losses are the cause of high heat loss, which has to be dissipated over a relatively small area. The maximum permissible semiconductor temperature is critical to failure, which is why minimizing the thermal resistance between the semiconductor and the coolant is of central importance. For efficient cooling, the power electronics considered here are mounted on coolers, through which fluid flows. These coolers typically comprise cooling fin arrangements through which the fluid flows.

SUMMARY

The cooler according to the invention enables quick and easy production, wherein in particular the cooling fin arrangement can be produced quickly and inserted correctly due to its one-piece configuration. The cooler according to the invention moreover enables very efficient cooling of the power electronics. The cooler according to the invention is in particular designed to cool power electronics. These power electronics comprise one or more power semiconductors that are typically arranged in a substrate. The cooler comprises a housing that is designed to accommodate the power electronics. The housing is preferably plate-shaped, for example with two cooling plates which define a cooling channel between them through which cooling fluid can flow. The cooling channel forms a cavity. A cooling fin arrangement with a large number of cooling fins is disposed in this cavity. The cooling fin arrangement is in particular an insert that is inserted between the two cooling plates. The cooling channel and the cooling fin arrangement are configured to allow the passage of a cooling fluid. Cooling is in particular accomplished with a fluid in the liquid aggregate state. The cooling fin arrangement is configured such that the fluid can flow through it along a longitudinal axis. A transverse axis is defined perpendicular to the longitudinal axis and thus also perpendicular to the direction of flow. A vertical axis is defined perpendicular to the transverse axis and perpendicular to the longitudinal axis. The cooling fin arrangement in particular extends significantly further in the direction of the longitudinal axis and in the direction of the transverse axis than in the direction of the vertical axis. The power electronics are positioned along the vertical axis above or below the cooling fin arrangement. A plurality of heat sources of the power electronics, in particular a plurality of the power semiconductors, can be positioned along the longitudinal axis and in part also along the transverse axis. The cooling fin arrangement comprises a plurality of cooling fin sections. There are in particular two to ten different cooling fin sections. Each two adjacent cooling fin sections have different fin geometries. As will be explained in detail, the cooling fin arrangement can comprise an intermediate section between two cooling fin sections. The intermediate section can also have cooling fins. The entire cooling fin arrangement is a single component that is inserted. Therefore, all of the cooling fin sections of the cooling fin arrangement are fixedly connected to one another. Adjacent cooling fin sections can be fixedly connected directly to one another or fixedly connected to one another via the aforementioned intermediate sections. It is preferably provided that the here-described cooler comprises only one cooling fin arrangement. However, it is also possible for further cooling fin arrangements to be inserted in addition to the here-described cooling fin arrangement comprising the plurality of cooling fin sections. The fixed connection of all the cooling fin sections of the cooling fin arrangement has the advantage that only one component has to be inserted. The fixed connection of the cooling fin sections to one another furthermore also sets the spacing between the cooling fin sections, for example via the intermediate sections, so that it can no longer mistakenly be changed during assembly. The individual cooling fin sections can no longer be switched or turned during assembly, because their alignment relative to one another is set by the fixed connection between them. The material used for the cooling fin arrangement is preferably aluminum or another material with correspondingly high thermal conductivity or a corresponding coating.

It is generally possible to fixedly connect the individual cooling fin sections or also the intermediate sections to one another after their production. Particularly preferably, however, it is provided that the cooling fin arrangement is made of one piece. The cooling fin arrangement is in particular produced by forming a metal sheet into a turbulence plate. All of the cooling fin sections and possibly the intermediate sections of the cooling fin arrangement are created from the one metal sheet, so that forming the metal sheet results in a cooling fin arrangement which is made of one piece, namely the one metal sheet, and in which all of the cooling fin sections are fixedly connected to one another, either directly connected to one another or connected to one another via the intermediate sections.

The turbulence plate in particular comprises a large number of rows of fins. The individual row of fins extends perpendicular to the longitudinal axis along the transverse axis. The individual row of fins comprises a large number of fins. The row of fins in particular has a wave shape. Two adjacent fins are connected to one another by this wave shape via a crest or trough portion of the wave shape. The crest or trough portion of the wave shape or the row of fins extends in particular substantially in a plane subtended by the longitudinal axis and the transverse axis.

The extent of the intermediate sections in longitudinal direction is preferably substantially shorter than that of the cooling fin sections. The single intermediate section can preferably be formed by a row of fins. It is preferably provided that, in at least one cooling fin section, the fins have a first length measured parallel to the longitudinal axis and the adjacent intermediate section has a second length, also measured parallel to the longitudinal axis. The second length is greater than the first length; the entire intermediate section is thus longer than an individual fin of the adjacent cooling fin section.

The geometry of the individual cooling fin sections is preferably taken into account when producing the cooling fin arrangement, in particular by forming a metal sheet into a turbulence plate. It is therefore advantageous if the cooling fin arrangement has a constant material thickness and/or a constant fin height and/or a constant period length across all of the cooling fin sections and intermediate sections. The material thickness is specified by the thickness of the processed metal sheet. The fin height is measured along the vertical axis. The period length is measured along the transverse axis within a row of fins.

When designing the cooler, it was taken into account that the coolant is heated in the direction of flow by the waste heat of the power semiconductors. The power semiconductor which in terms of flow direction is in the back is consequently cooled less effectively than the frontmost power semiconductor, which results in different service lives and, above all, different electrical behavior. The different cooling fin sections are therefore preferably disposed one behind the other along the longitudinal direction and thus along the direction of flow, so that the fin geometries change along the flow direction. This makes it possible to adjust the heat transfer coefficient between the fins and the coolant.

The flow resistance from one cooling fin section to the next cooling fin section can be increased in different ways, thereby also increasing the heat transfer coefficient.

It is therefore preferably provided that the fins are positioned at an angle of attack relative to the longitudinal axis and the angle of attack differs in at least two adjacent cooling fin sections. It is in particular provided that the angle of attack increases along the direction of flow from one cooling fin section to the next cooling fin section. The respective cooling fin section preferably comprises a plurality of rows of fins disposed one behind the other. As described in the context of the turbulence plate, the rows of fins extend along the transverse axis and directly abut one another along the longitudinal axis. The fins in adjacent rows of fins are preferably positioned in different setting directions relative to the longitudinal axis, so that the fins of the one row are positioned at 10°, for example, and the fins of the next row are positioned at −10° relative to the longitudinal axis. This alternating positioning of the fins deliberately increases the flow resistance in order to achieve the highest possible heat transfer coefficient.

In addition or as an alternative to increasing the angle of attack from one cooling fin section to the next cooling fin section, the flow resistance can also be increased by reducing the length of the individual fin measured along the longitudinal axis. This is interesting in particular in combination with the above-described alternating setting direction of the individual rows of fins, because the flow resistance with this alternating setting direction and the correspondingly short fins (measured parallel to the longitudinal axis) is correspondingly high.

The invention also includes an arrangement. The arrangement in turn combines the described cooler and the associated power electronics comprising at least one power semiconductor. As described, the power electronics are disposed on the cooler.

BRIEF DESCRIPTION OF THE DRAWINGS

An embodiment example of the invention is described in detail in the following with reference to the accompanying drawing. The drawing shows.

DETAILED DESCRIPTION

Figure 1:
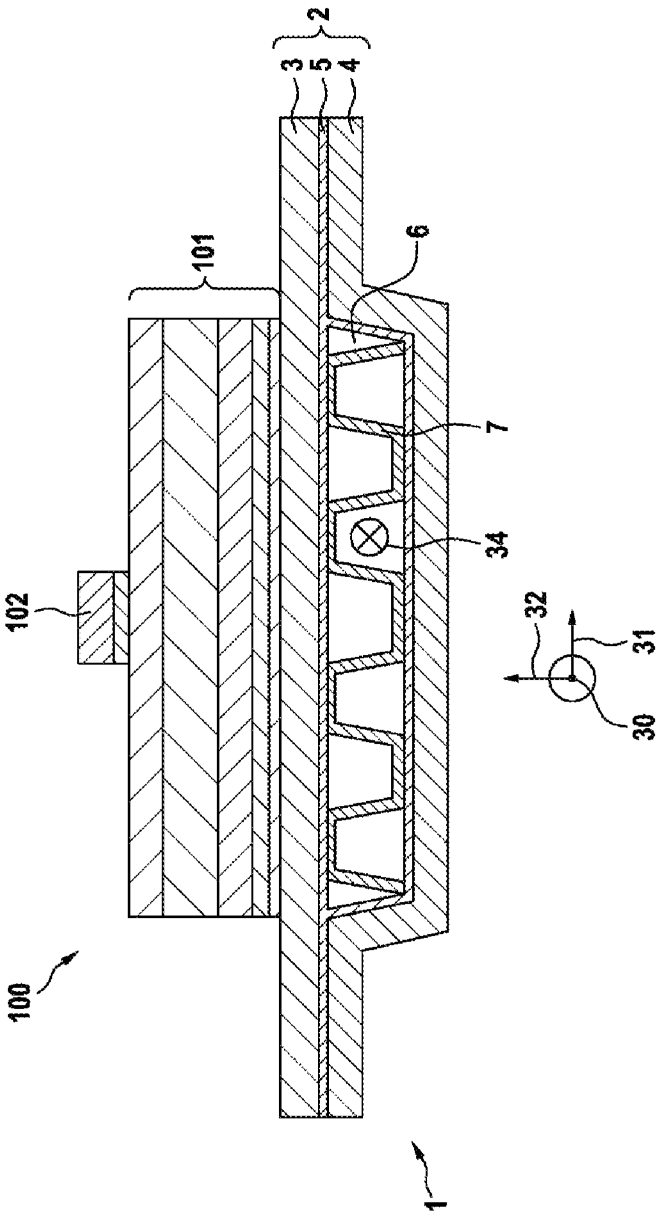
FIG. 1 a schematic sectional view of an arrangement according to the invention comprising a cooler according to the invention according to an embodiment example, FIG. 2 a schematic plan view of the cooler according to the invention according to the embodiment example, FIG. 3 a plan view onto a cooling fin arrangement of the cooler according to the invention according to the embodiment example, FIG. 4 a partial view of the cooling fin arrangement of FIG. 3, and FIG. 5 a multipart configuration of a cooling fin arrangement.

An arrangement 100 comprising a cooler 1 is described in detail in the following with reference to FIGS. 1 to 4. According to the schematic sectional view in FIG. 1, the arrangement 100 comprises power electronics 101 which are positioned on the cooler 1. The power electronics 101 comprise one or more power semiconductors 102, which are considered here to be primary heat sources.

As shown in FIGS. 1 to 4, a longitudinal axis 30, a transverse axis 31 and a vertical axis 32 are defined on the cooler 1. The three axes 30, 31, and 32 are all perpendicular to one another.

FIG. 1 also shows that the cooler 1 is plate-shaped with two cooling plates 3, 5 which are connected to one another and parallel and together form a housing 2 of the cooler 1. Between the cooling plates 3, 4, there is a cooling channel 6. The two cooling plates 3, 4 are connected to one another via a solder layer 5.

A cooling fin arrangement 7, which can likewise be connected to the housing 2 via the solder layer, is located in the cooling channel 6 as an insert.

Figure 2:
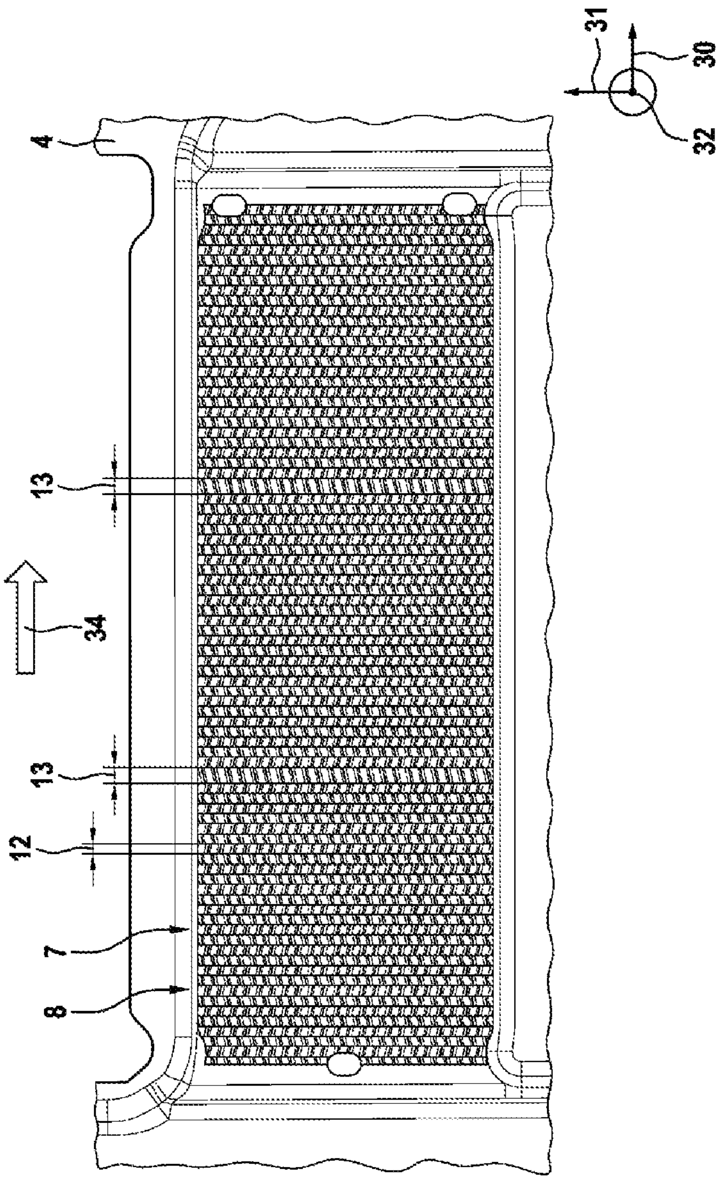

FIG. 2 shows a plan view onto the cooler 1. The upper cooling plate 3 is hidden for the sake of clarity, so that the lower cooling plate 4 with the cooling fin arrangement 7 accommodated in it.

The housing 2 is configured such that a cooling fluid can pass through it along a flow direction 34. The flow direction 34, which extends parallel to the longitudinal axis 30, is the main flow direction from the housing-side inlet to the housing-side outlet of the fluid. Inside the cooling fin arrangement 7, the fluid can also flow with a directional component parallel to the transverse axis 31.

Figure 3:
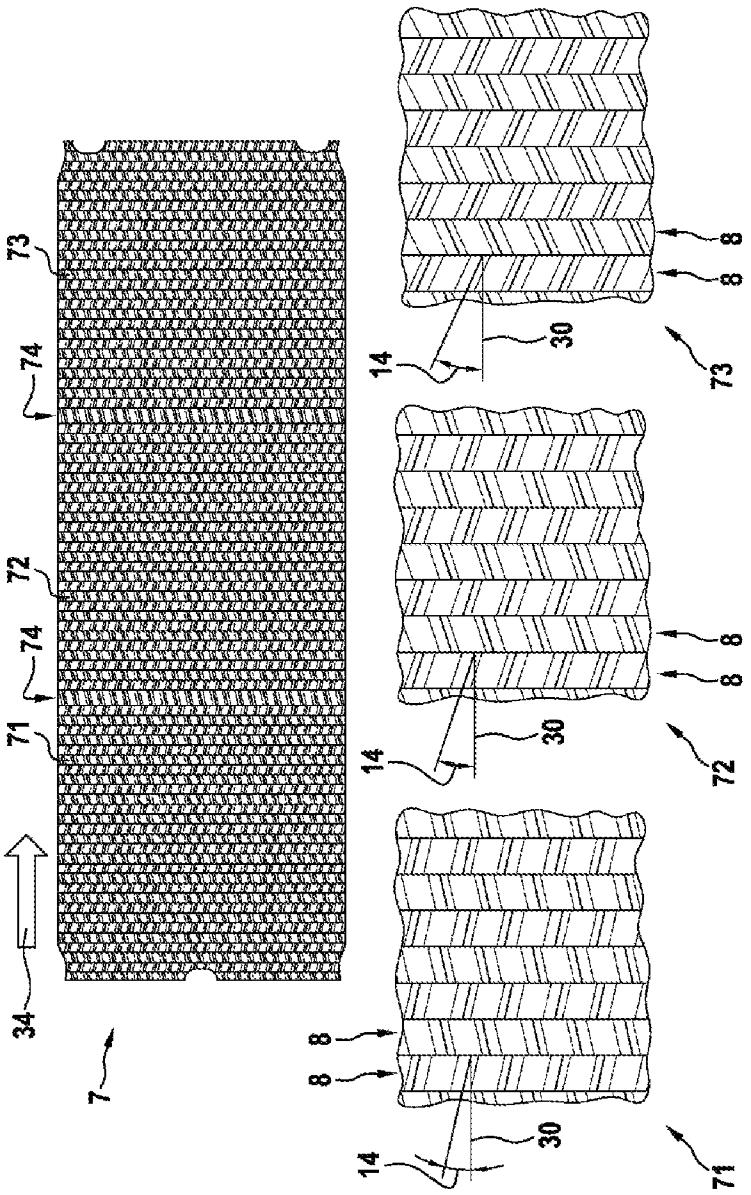

FIG. 3 shows the cooling fin arrangement 7 which, along the longitudinal axis 30 or along the flow direction 34, is composed of a first cooling fin section 71, a second cooling fin section 72 and a third cooling fin section 73. Respective adjacent cooling fin sections 71 to 73 are fixedly connected to one another via an intermediate section 74. The two intermediate sections 74 are also part of the cooling fin arrangement 7.

Figure 5:
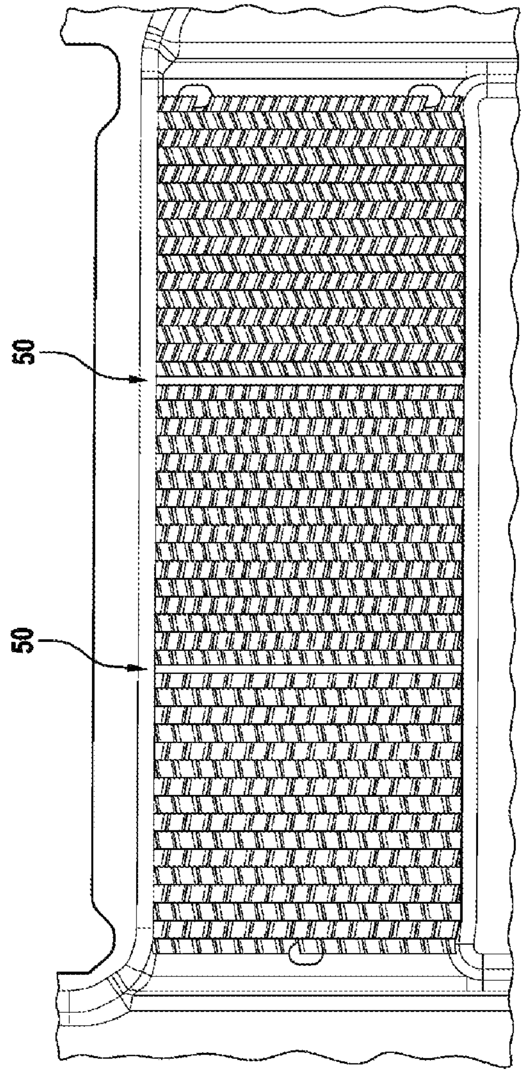

The entire cooling fin arrangement 7 with all three cooling fin sections 71 to 73 and the two intermediate sections 74 is created from one metal sheet that is formed into a turbulence plate. In contrast, FIG. 5 shows a multipart configuration of the cooling fin arrangement 7. As FIG. 5 shows, in this configuration the individual turbulence plates have to be inserted into the cooling plate 3 with a gap 50 between them. Care must be taken to ensure that the individual turbulence plates are not switched or turned. The gap 50 has to be maintained as well.

Figure 4:
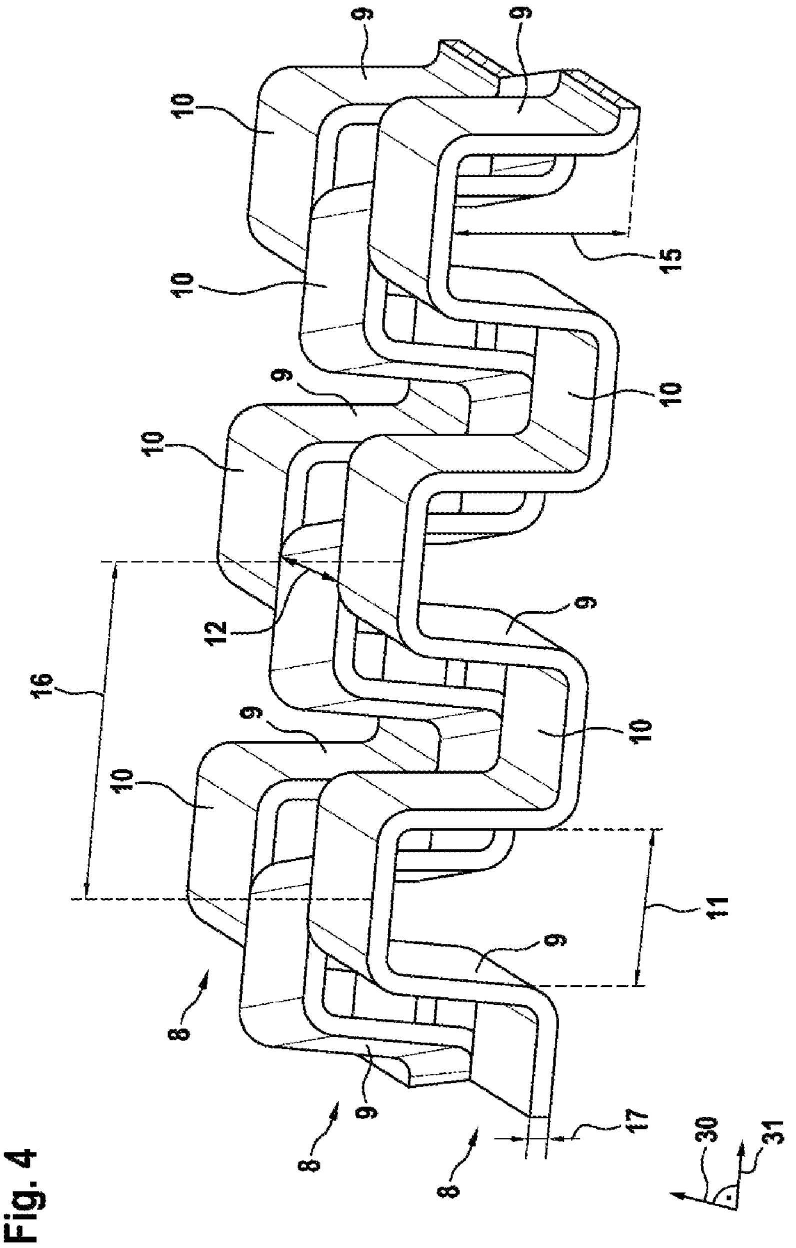

In the shown embodiment example according to FIGS. 1 to 4, the cooling fin arrangement 7 is composed of a large number of rows of fins 8. Each row of fins 8 extends along the transverse axis 31. The large number of rows of fins 8 are disposed one behind the other along the longitudinal axis 30, directly adjacent to one another. FIG. 4 shows in a detail view of three of these rows of fins 8. The individual row of fins 8 is wave-shaped, wherein two respective adjacent fins 9 are connected to one another by a crest or trough portion 10 of the wave shape. Parallel to the transverse axis 31 this results in a spacing 11 between two adjacent fins 9. A period length 16 is measured in the same direction.

The individual fin 9 extends parallel to the longitudinal axis 30 over a first length 12. A height 15 of the fins 9 or the rows of fins 8 is defined along the vertical axis 32. This height 15 also corresponds to the overall height of the cooling fin arrangement 7. The metal sheet used results in a material thickness 17.

FIG. 3 shows a detailed illustration of the three cooling fin sections 71, 72 and 73. In each case, a respective angle of attack 14 of the individual fins 9 relative to the longitudinal axis 30 is shown. The direction of the angle of attack 14 changes within a cooling fin section 71, 72, 73 from one row of fins 8 to the adjacent next row of fins 8.

To increase the flow resistance along the flow direction 34, it is provided that the angle of attack 14 increases from the first cooling fin section 71 to the second cooling fin section 72 and from the second cooling fin section 72 to the third cooling fin section 73.

Additionally or alternatively, it is also provided that the first length 12, which describes the extent of the fins 9 parallel to the longitudinal axis 30, decreases from the first cooling fin section 71 to the second cooling fin section 72 and from the second cooling fin section 72 to the third cooling fin section 73.

The individual cooling fin sections 71, 72, 73 extend along the longitudinal axis 30, preferably substantially further than the two intermediate sections 74. The respective intermediate section 74 is preferably formed by only one row of fins 8. A second length 13, which describes the extent of the intermediate section 74 along the longitudinal axis 30, is preferably longer than the first length 12 in the adjacent cooling fin sections 71, 72, 73.

To change the flow resistance from one cooling fin section to the next cooling fin section, other fin geometries 9, for example the spacing 11 or the height 15, can also be changed in addition to the angle of attack 14 and/or the first length 12. For production-related reasons when producing the turbulence plate by forming, however, it is preferably provided that the period length 16 and thus the spacing 11, the height 15, and the material thickness 17 are kept constant over the entire cooling fin arrangement 7 made of one piece.

What is claimed is:

1. A cooler for cooling power electronics, the cooler comprising:

a housing for accommodating the power electronics and a cooling fin arrangement with a plurality of fins in a cooling channel of the housing, wherein fluid can flow through the cooling fin arrangement along a longitudinal axis, wherein the cooling fin arrangement comprises a plurality of cooling fin sections wherein adjacent cooling fin sections have different fin geometries and wherein the cooling fin sections are fixedly connected to one another, wherein the fins are positioned at an angle of attack relative to the longitudinal axis and the angle of attack differs in at least two adjacent cooling fin sections.

2. The cooler according to claim 1, wherein the cooling fin arrangement is made of one piece.

3. The cooler according to claim 2, wherein the cooling fin arrangement is produced by forming a metal sheet into a turbulence plate.

4. The cooler according to claim 1, wherein two respective adjacent cooling fin sections are fixedly connected to one another by an intermediate section of the cooling fin arrangement.

5. The cooler according to claim 4, wherein, in at least one cooling fin section, the fins have a first length measured parallel to the longitudinal axis and the adjacent intermediate section has a second length measured parallel to the longitudinal axis, wherein the second length is greater than the first length.

6. The cooler according to claim 1, wherein the cooling fin arrangement has a constant material thickness and/or a constant fin height and/or a constant period length.

7. The cooler according to claim 1, wherein the angle of attack increases along a direction of flow from one cooling fin section to the next cooling fin section.

8. The cooler according to claim 1, wherein the fins have a first length parallel to the longitudinal axis and the first length decreases from one cooling fin section to the next cooling fin section.

9. An arrangement comprising a cooler according to claim 1 and power electronics comprising a plurality of power semiconductors disposed on the housing.

* * * * *